US012394742B2

United States Patent
Chen et al.

(10) Patent No.: US 12,394,742 B2
(45) Date of Patent: Aug. 19, 2025

(54) INTERCONNECT STRUCTURE FOR HIGH POWER GAN MODULE INCLUDING A PRINTED PLANAR INTERCONNECT LINE AND METHOD FOR MAKING THE SAME

(71) Applicant: Texas Instruments Incorporated, Dallas, TX (US)

(72) Inventors: Jie Chen, Plano, TX (US); Yong Xie, Plano, TX (US); Rajen Manicon Murugan, Dallas, TX (US); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 543 days.

(21) Appl. No.: 17/028,353

(22) Filed: Sep. 22, 2020

(65) Prior Publication Data

US 2021/0175195 A1     Jun. 10, 2021

Related U.S. Application Data

(60) Provisional application No. 62/945,672, filed on Dec. 9, 2019.

(51) Int. Cl.
*H01L 23/00* (2006.01)
*H01L 23/66* (2006.01)
*H01L 25/16* (2023.01)

(52) U.S. Cl.
CPC .............. *H01L 24/24* (2013.01); *H01L 24/73* (2013.01); *H01L 24/82* (2013.01); *H01L 24/92* (2013.01); *H01L 25/16* (2013.01); *H01L 23/66* (2013.01); *H01L 2223/6666* (2013.01); *H01L 2224/24101* (2013.01); *H01L 2224/24175* (2013.01); *H01L 2224/73267* (2013.01); *H01L 2224/82102* (2013.01); *H01L 2224/82104* (2013.01); *H01L 2224/92244* (2013.01); *H01L 2924/1033* (2013.01); *H01L 2924/13091* (2013.01); *H01L 2924/1426* (2013.01)

(58) Field of Classification Search
CPC ......... H01L 24/24; H01L 24/73; H01L 24/82; H01L 24/92; H01L 25/16; H01L 2224/82102; H01L 2224/82104; H01L 23/66; H01L 2223/6666; H01L 2224/1306; H01L 2224/49175
USPC .......................................................... 257/76
See application file for complete search history.

(56) References Cited

U.S. PATENT DOCUMENTS 6,501,525 B2 * 12/2002 Huang .............. G02F 1/136277
                                                      349/150
8,981,380 B2 *  3/2015 Briere ................. H01L 21/8258
                                                       257/76

(Continued)

OTHER PUBLICATIONS

Set Definition & Meaning—Merriam-Webster.*

(Continued)

*Primary Examiner* — Khiem D Nguyen
(74) *Attorney, Agent, or Firm* — Ronald O. Neerings; Frank D. Cimino

(57) ABSTRACT

In described examples of a circuit module, a multilayer substrate has a conductive pad formed on a surface of the multilayer substrate. An integrated circuit (IC) die is bonded to the surface of the substrate in dead bug manner, such that a set of bond pads formed on a surface of the IC die are exposed. A planar interconnect line formed by printed ink couples the set of bond pads to the conductive pad.

14 Claims, 8 Drawing Sheets

(56) References Cited

U.S. PATENT DOCUMENTS

| | | | | |
|---|---|---|---|---|
| 9,159,673 | B2* | 10/2015 | Ko | H01L 23/49827 |
| 10,199,487 | B1* | 2/2019 | Elsayad | H01L 29/2003 |
| 10,690,559 | B1* | 6/2020 | Liu | G01L 1/18 |
| 2004/0018712 | A1* | 1/2004 | Plas | H01L 23/481 |
| | | | | 438/612 |
| 2007/0155057 | A1* | 7/2007 | Wang | H01L 23/5389 |
| | | | | 438/122 |
| 2007/0228534 | A1* | 10/2007 | Uno | H01L 24/91 |
| | | | | 257/E23.079 |
| 2009/0173919 | A1* | 7/2009 | Webster | C09D 11/101 |
| | | | | 252/514 |
| 2012/0039066 | A1* | 2/2012 | Hatanaka | G02B 5/0284 |
| | | | | 205/175 |
| 2016/0093525 | A1* | 3/2016 | Cook | H01L 23/5389 |
| | | | | 257/676 |
| 2016/0216548 | A1* | 7/2016 | Fujikawa | H01L 27/1222 |
| 2016/0240471 | A1* | 8/2016 | Klowak | H01L 23/53228 |
| 2016/0268190 | A1* | 9/2016 | McKnight-MacNeil | |
| | | | | H01L 21/78 |

OTHER PUBLICATIONS

"MultiChip, Packages", Texas Instruments, Inc., Literature No. SNOA287, National Semiconductor, Apr. 2000, pp. 1-5.

"Wire bonding", Wikipedia, available at https://en.wikipedia.org/wiki/Wire_bonding on Mar. 26, 2020, pp. 1-4.

Yong Xie and Paul Brohlin, "Optimizing GaN performance with an integrated driver", Texas Instruments, Inc., SLYY085, Mar. 2016, pp. 1-7.

* cited by examiner

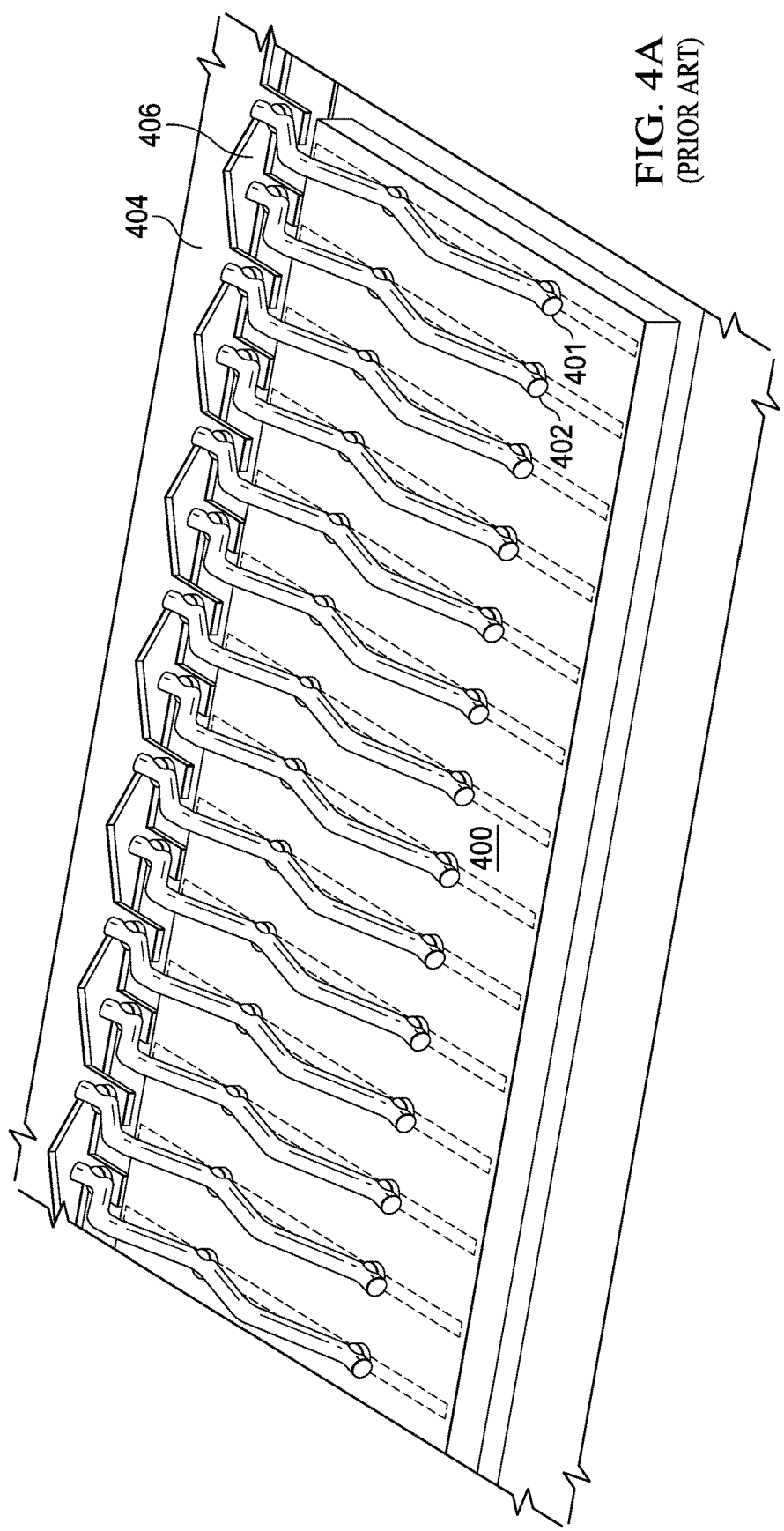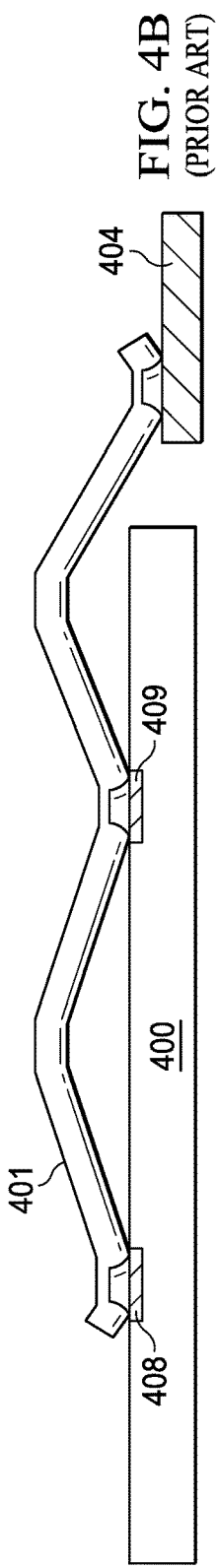
FIG. 4A (PRIOR ART)
FIG. 4B (PRIOR ART)

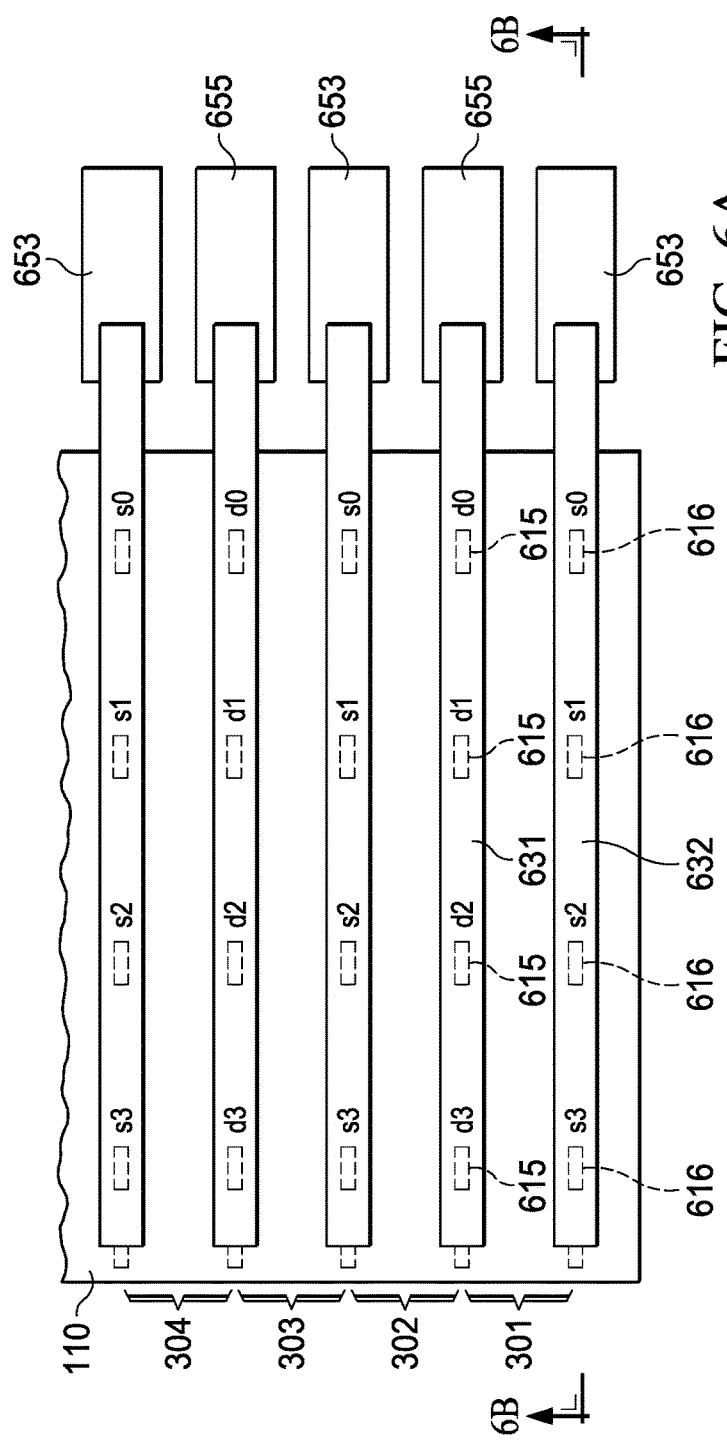
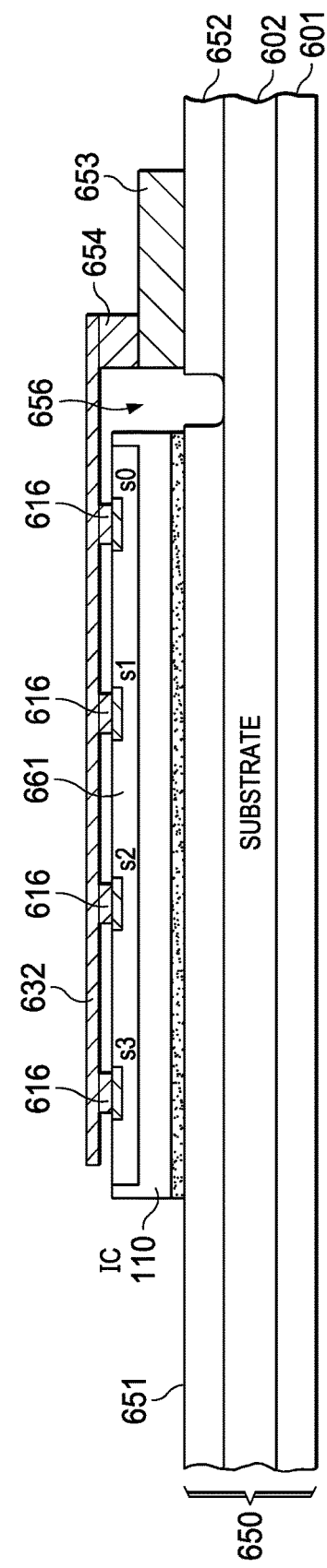
FIG. 6A
FIG. 6B

INTERCONNECT STRUCTURE FOR HIGH POWER GAN MODULE INCLUDING A PRINTED PLANAR INTERCONNECT LINE AND METHOD FOR MAKING THE SAME

CROSS-REFERENCE TO RELATED APPLICATION

This application claims priority to U.S. Provisional patent Application No. 62/945,672 filed Dec. 9, 2019, the entirety of which is incorporated herein by reference.

TECHNICAL FIELD

This relates to packaging and interconnect structures for high power modules.

BACKGROUND

Gallium nitride (GaN) is revolutionizing the high-power semiconductor field by enabling high-speed switching, increased efficiency, and higher power density than possible with silicon MOSFETs.

GaN's inherent lower gate and output capacitance enables MHz switching frequency operation while reducing gate and switching losses to increase efficiency. Unlike silicon, GaN naturally lacks a body diode, which eliminates reverse recovery loss and further increases efficiency and reduces switch node ringing and electro-magnetic interference (EMI).

GaN transistors can switch much faster than silicon MOSFETs, thus having the potential to achieve lower switching losses. At high slew rates, however, certain package types can limit GaN FET switching performance. Integrating the GaN FET and driver in the same package reduces parasitic inductances and optimizes switching performance. Integrating the driver also enables the implementation of protection features.

SUMMARY

In described examples of a circuit module, a multilayer substrate has a conductive pad formed on a surface of the multilayer substrate. An integrated circuit (IC) die is bonded to the surface of the substrate in dead bug manner, such that a set of bond pads formed on a surface of the IC die are exposed. A planar interconnect line formed by printed ink couples the set of bond pads to the conductive pad.

BRIEF DESCRIPTION OF THE DRAWINGS

FIGS. 4A and 4B illustrates a prior art wire bond interconnect.

FIG. 6A is a top view and FIG. 6B is a cross-sectional view of an example planar interconnect structure.

DETAILED DESCRIPTION

Figure 1:
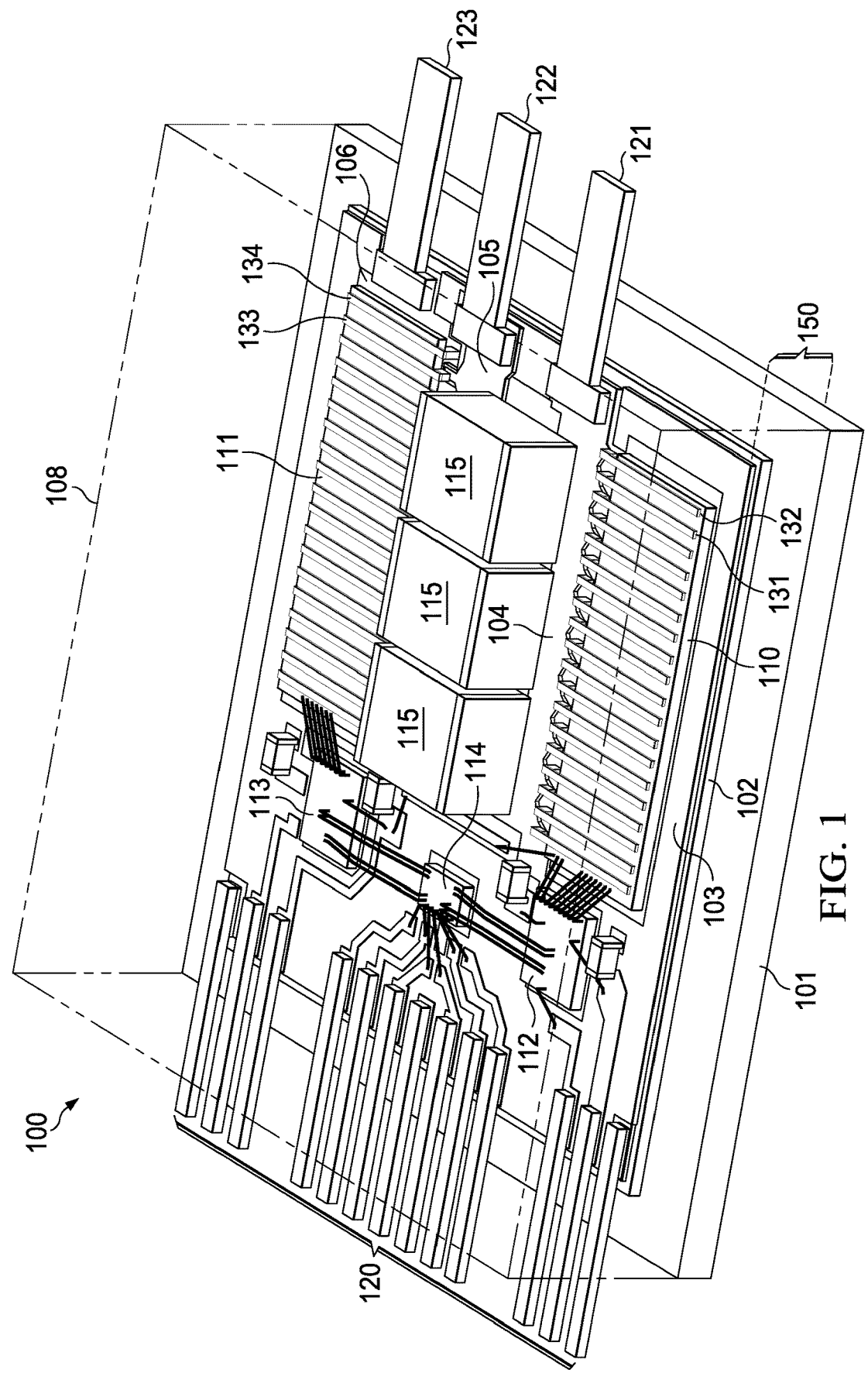
FIG. 1 is an isometric view of an example module that includes an example planar interconnect structure.

In the drawings, like elements are denoted by like reference numerals for consistency.

Gallium nitride (GaN) is a material that can be used in the production of semiconductor power devices as well as RF components and light emitting diodes (LEDs). GaN devices are being used in power conversion, radio frequency (RF), and analog applications. GaN's ability to conduct electrons significantly more efficiently than silicon, while being able to be manufactured at a lower cost than silicon provides several advantages to the use of GaN devices over silicon devices such as metal oxide semiconductor field effect transistors (MOSFET).

GaN FET devices inherently have a lower on-resistance than MOSFET devices giving lower conductance losses. Faster GaN devices yield less switching losses. Lower intrinsic gate capacitance of GaN devices results in lower losses when charging and discharging devices, therefore less power is needed to drive a GaN device.

Because GaN devices have a much lower gate charge and lower output capacitance than silicon MOSFETs, GaN devices are therefore capable of operating at a switching frequency that is significantly greater than a comparable size MOSFET device. An example GaN FET device is capable of switching at least ten times faster than a comparable MOSFET device.

The superior characteristics of GaN imposes stringent requirements for package electrical and thermal performances. The inherent high di/dt and dv/dt may cause switching loss, ringing, and reliability issues.

For high volume automotive and industrial applications, high power FET switching devices may be fabricated using low cost lead frame (LF) technology. The FET packaging needs to provide heat flux uniformity to minimize occurrence of thermal hot spots on FETs to improve safe operating area (SOA) and reliability.

A planar interconnect structure for a high-power semiconductor module is described hereinbelow that provides improved electrical and thermal performance over typical bond wire interconnect technology.

FIG. 1 is an isometric view of an example module 100 that includes an example planar interconnect structure. In this example, multiple devices are mounted on a multilayer substrate 150 to form a half-bridge power stage. In this example, GaN FET 110 and 111 are fabricated in separate integrated circuit (IC) die and are both mounted on a multilayer substrate 150 that includes ceramic layer 102, heat dispersing layer 101, patterned layers such as ground bus LF 104, source bus 105, switched bus LF 106, and protective layer 103.

Drivers 112, 113 and pre-driver 114 are each fabricated as separate IC chips and are mounted on multilayer substrate 150 of module 100. In this example, drivers 112, 113 and predriver 114 are mounted dead-bug style using an adhesive bonding layer and interconnected using bond wires. Driver 112 is coupled to drive GaN FET 110, while driver 113 is coupled to drive GaN FET 111 via bond wires. Pre-driver 114 coordinates the operation of driver 112 and driver 113.

In another example, drivers 112, 113 and pre-driver 114 may be mounted pads down using solder, conductive paste, or other known or later developed chip mounting techniques. In this case, conductive signal lines formed in one or more layers of multilayer substrate 150 may be used to interconnect drivers 112, 113, and pre-driver 114. Terminal pads may then be provided to couple to GaN FET transistors 110, 111 using bond wires or planar interconnect lines as described in more detail hereinbelow.

Integrating GaN FET transistors 110, 111 with respective drivers 112, 113 in a same multi-chip module eliminates common-source inductance and significantly reduces the inductance between the driver output and GaN gate, as well as the inductance in driver grounding.

Terminals 121, 122, 123 provide a low impedance path for the current being switched by GaN FETs 110, 111. A set of terminals 120 receive control signals from an external source along with power and ground for operation of module 100.

As will be described in more detail hereinbelow, a set of planar interconnects is fabricated on top of GaN FET 110, 111 to couple the drain and source regions to terminals 121, 122, 123. In this example, planar interconnect line 131 is representative of a set of planar interconnect lines that couple the source region of GaN FET 110 to terminal 121. Planar interconnect line 132 is representative of a set of planar interconnect lines that couple the drain region of GaN FET 110 to terminal 123. Planar interconnect line 133 is representative of a set of planar interconnect lines that couple the drain region of GaN FET 111 to terminal 122. Planar interconnect line 134 is representative of a set of planar interconnect lines that couple the source region of GaN FET 111 to terminal 123.

Decoupling capacitors 115 are coupled between ground bus LF 104 and source bus 105. Module 100 is encapsulated by mold material 108 to form a finished module as indicated by the outline of mold material 108.

As will be described in more detail herein below, the planar interconnect lines provide low resistance and intrinsic inductance and capacitance (RLC) and thereby allow for fast switching. Mounting the unpackaged GaN FET IC die directly on the ceramic core multilayer substrate 150 provides good heat flux uniformity and minimizes thermal hot spots within the module.

Figure 2:
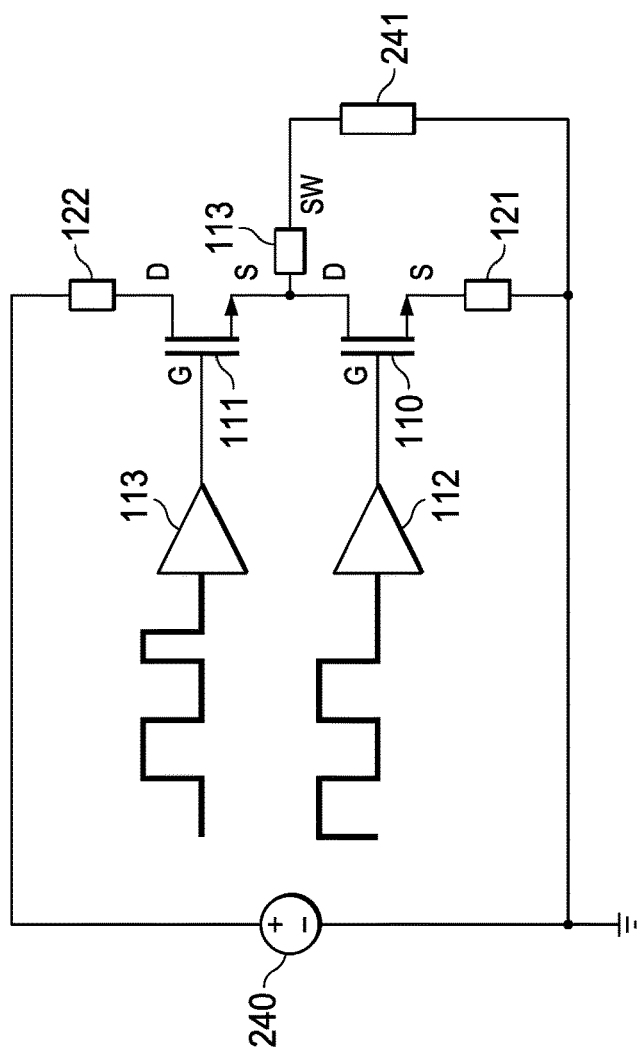
FIG. 2 is a schematic of an example GaN switching module.

FIG. 2 is a partial schematic of example GaN switching module 100 that can be used to simulate the operation of switching module 100. In this example, GaN FET 111 operates on the high side of a half-bridge switch, while GaN FET 110 operates on the low side. In this example, a 480 v external source is coupled to switching module via terminals 121, 122. Switched terminal 123 is coupled to an external load represented by 241. Drivers 112, 113 receive control signals from pre-driver 114 (FIG. 1). In this example, the control signals have a duty cycle of approximately 50% and cause GaN FETs 110, 111 to switch at a rate that produces a voltage of approximately 240 volts on switched terminal 123. In this simulation example, a current of approximately 8 amps flows through load 241.

Figure 3:
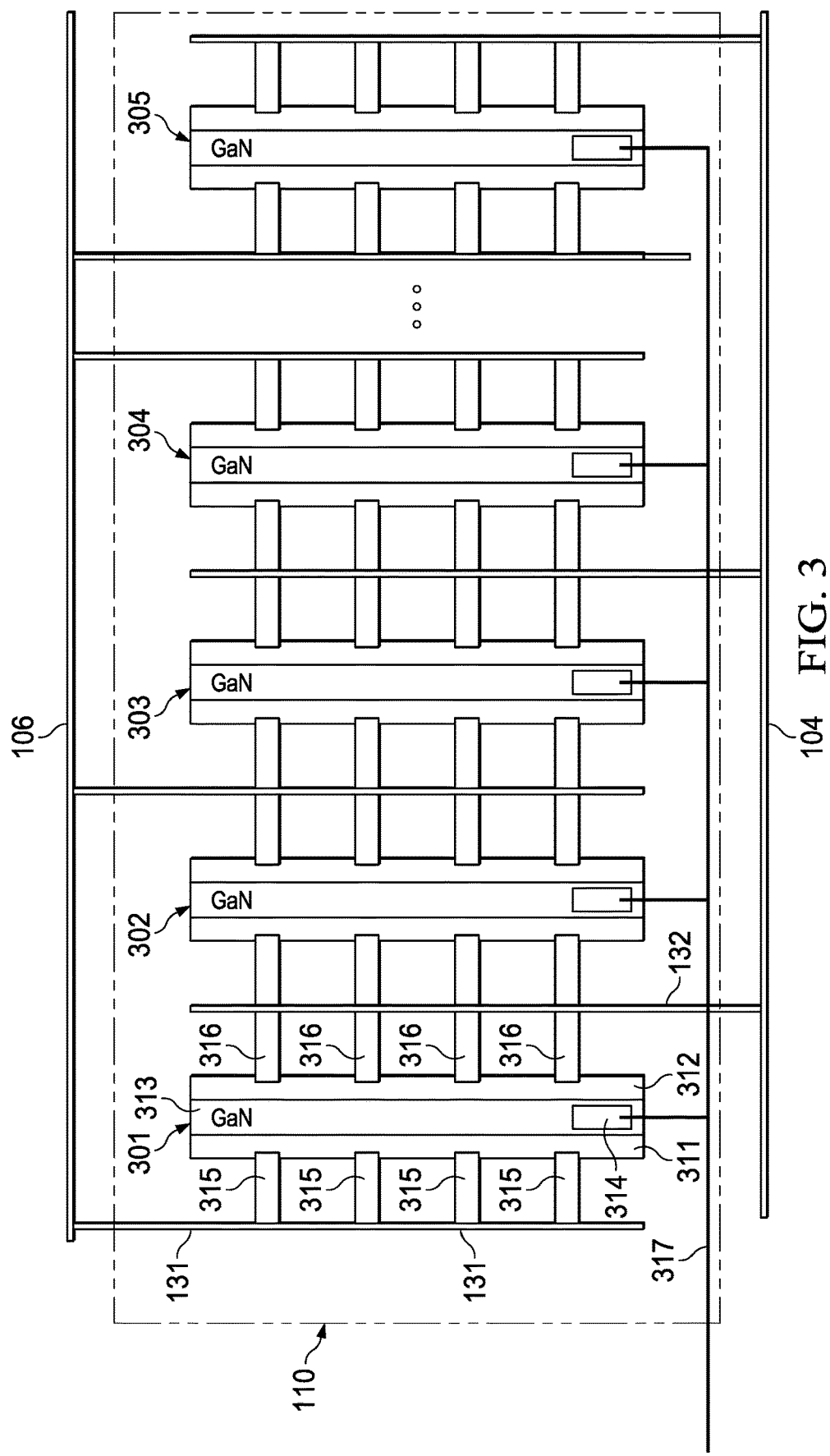
FIG. 3 is a schematic of an example segmented GaN FET transistor.

FIG. 3 is a schematic of an example segmented GaN FET transistor that is representative of GaN FET 110. GaN FET 111 is constructed in a similar manner. To handle the large currents required for automotive and industrial applications, FET 110 is segmented into a set of parallel source/drain regions that are separated by respective gate regions. In this example, only segments 301, 302, 303, 304, 305 are illustrated for clarity. GaN FET 110 contains additional segments not shown here.

Representative segment 301 includes drain region 311 and source region 312 that are separated by gate region 313. Gate contact 314 is coupled to driver 112 (FIG. 1) via drive signal line 317.

Multiple contacts 315 are provided to couple drain region 311 to planar interconnect line 131 and thereby to switched bus LF 106. Multiple contacts 316 are provided to couple source region 312 to planar interconnect line 132 and thereby to ground bus LF 104. In this example, each set of source/drains contacts includes four contacts. In another example, there may be fewer or more contacts. A larger number of contacts provides more even current flow through each segment.

FIGS. 4A and 4B illustrates a prior art wire bond interconnect. FIG. 4A illustrates an isometric view of a portion of a module that includes GaN FET 400. In this example, GaN FET 400 is a segmented FET similar to segmented GaN FET 110 (FIG. 3) that is mounted on a multilayer substrate to form a module similar to module 100 (FIG. 1). Wire bonding is used to connect respective bond pads on GaN FET 400 to a drain bus 404 and to a source bus 406. Bond wire 401 is representative of a set of source bond wires that connect respective bond pads in source region segments to the source bus 404. Bond wire 402 is representative of a set of drain bond wires that connect respective bond pads in drain region segments to the drain bus 406.

FIG. 4B is a cross-sectional view of GaN FET IC 400 illustrating source region bond pads 408, 409. Bond wire 401 connects bond pads 408, 409 to source bus 404 using a well-known wire bonding technique. The number of bond pads in each source/drain region segment is limited by spacing requirements for wire bonding.

Figure 5:
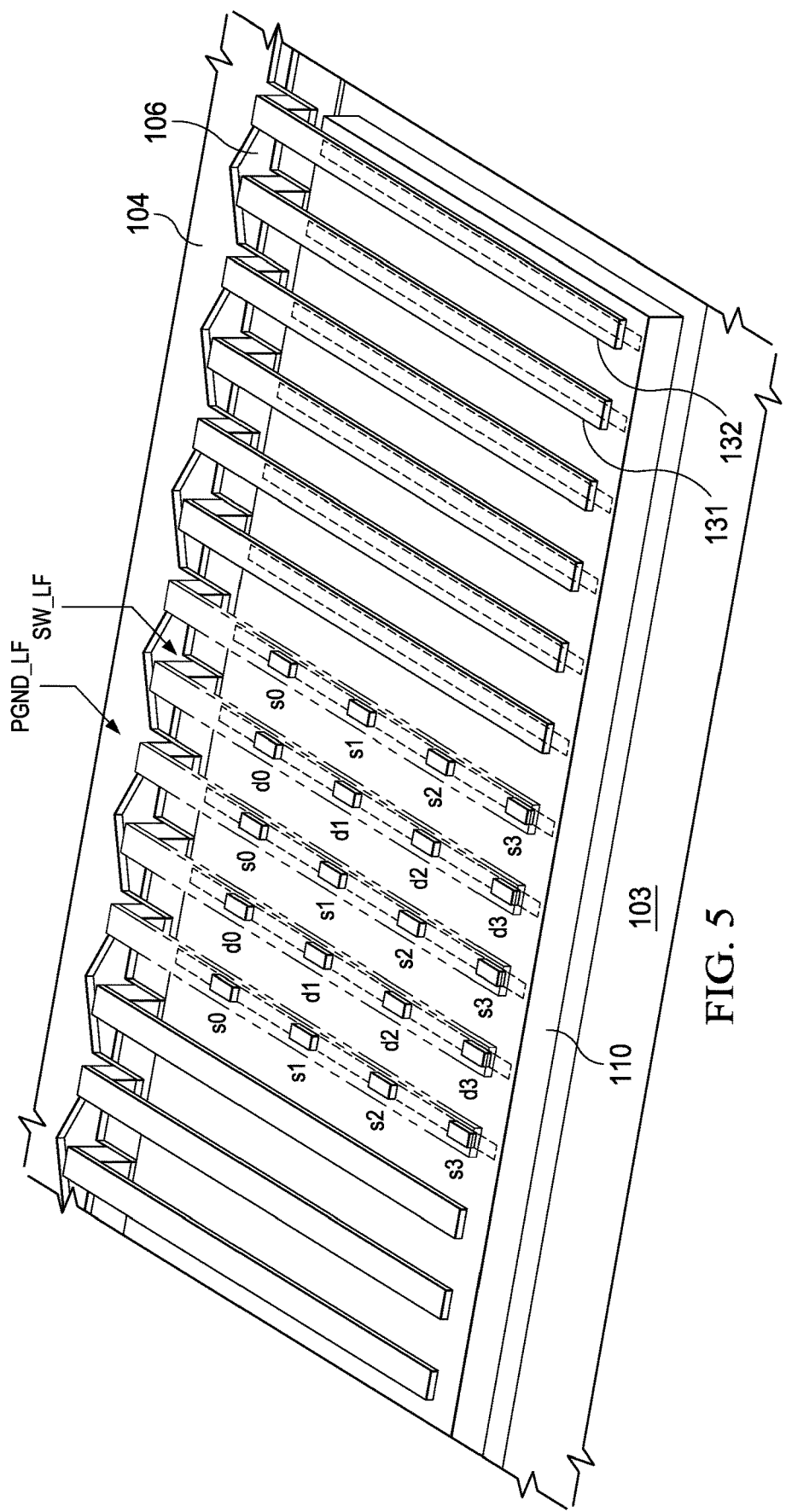
FIG. 5 is an isometric cut-away view that illustrates an example planar interconnect structure in more detail.

FIG. 5 is an isometric cut-away view that illustrates an example planar interconnect structure in more detail. In this example, each source/drain region of GaN FET 110 has four bond pads, indicated generally as s0, s1, s2, s3 and d0, d1, d2, d3. In this example, planar interconnect line 131 is representative of a set of planar interconnect lines that couple the source region of GaN FET 110 to ground bus LF 104 and thereby to terminal 121 (FIG. 1). Planar interconnect line 132 is representative of a set of planar interconnect lines that couple the drain region of GaN FET 110 to switched bus LF 106 and thereby to terminal 123 (FIG. 1).

The entire metal lead frame 104 is the power ground lead frame (PGND) that returns current to the bus capacitors 115 (see FIG. 1).

FIG. 6A is a top view and FIG. 6B is a cross-sectional view of an example planar interconnect structure in more detail. FIG. 6A illustrates a portion of GaN FET 110. As described hereinabove, GaN FET 110 is segmented into a set of parallel source/drain regions that are separated by respective gate regions. In this example, only segments 301, 302, 303, 304 are illustrated for clarity. GaN FET 110 contains additional segments not shown here.

In this example, each source/drain region of GaN FET 110 has four bond pads, indicated generally as s0, s1, s2, s3 and d0, d1, d2, d3. In this example, planar interconnect line 632 is representative of a set of planar interconnect lines that couple to the four bond pads of source region of GaN FET 110 to a set of source pads indicated generally at 653. In this example, a set of contacts 616 connect interconnect line 632 to respective source bond pads s0-s3. Source pads 653 are all coupled together by a source bus structure, not shown. Planar interconnect line 631 is representative of a set of planar interconnect lines that couple the drain region of GaN FET 110 to a set of drain pads indicated generally at 655. In this example, a set of contacts 615 connect interconnect line 631 to respective drain bond pads d0-d3. Drain pads 655 are all coupled together by a drain bus structure, not shown.

FIG. 6B illustrates a cross-sectional view of an example multilayer substrate 650 that includes a ceramic layer 602, a heat sink layer 601, and a patterned electrically conductive layer that includes example regions 651, 652. In this example, region 652 is the source bus that couples together the source pads 653. In other examples, the multilayer substrate may include more, or fewer, layers that are patterned to provide signal routing, dielectric isolation, etc.

In this example, the IC chip that forms GaN FET 110 is mounted the top surface of multilayer substrate 650. GaN FET 110 is mounted in a "dead bug" manner such a flat surface of the IC die is bonded to the surface of multilayer substrate 650 and the opposite surface that includes the bond pads such as s0-s3 and d0-d3 is facing away from multilayer substrate 650.

FIG. 6B illustrates a set of contact posts 616 that couple planar interconnect line 632 to bond pads s0-s3 on GaN FET 110. Riser 654 couples interconnect line 632 to source pad 653 and thereby to source bus 652. In this example, contact posts 616 and riser 654 are illustrated as separate structures that are connected to planar interconnect line 632. In another example, planar interconnect line 632, contacts 616 and/or riser 654 may be fabricated as a monolithic structure.

In this example, a dielectric region 656 separates the planar interconnect line 632 and riser 654 from electrically conductive region 651 and portions of GaN FET 110. Is this example, planar interconnect line 632 is approximately 60 μm thick. The contact posts, such as contact posts 616, are approximately 60 μm tall so that a uniform separation of approximately 60 μm exists between the top surface of IC die 110 and the bottom surface of the planar interconnect lines, such as planar interconnect line 632.

Figure 7A:
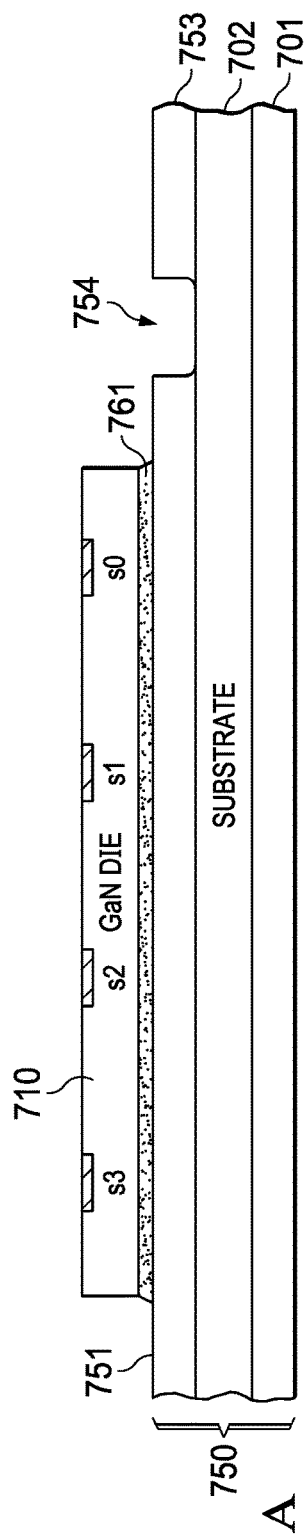
FIGS. 7A-7C are cross-sectional views illustrating fabrication of an example planar interconnect structure.
Figure 7B:
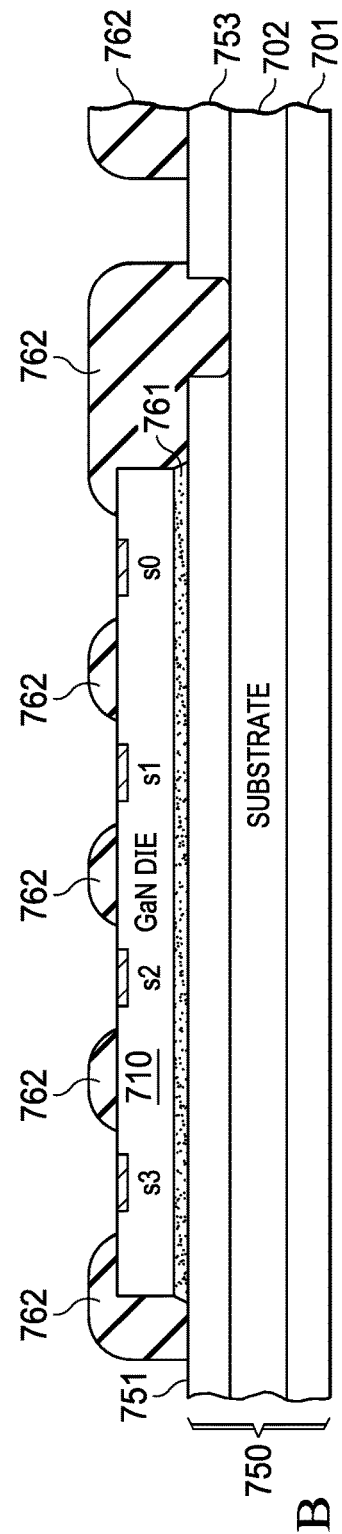
Figure 7C:
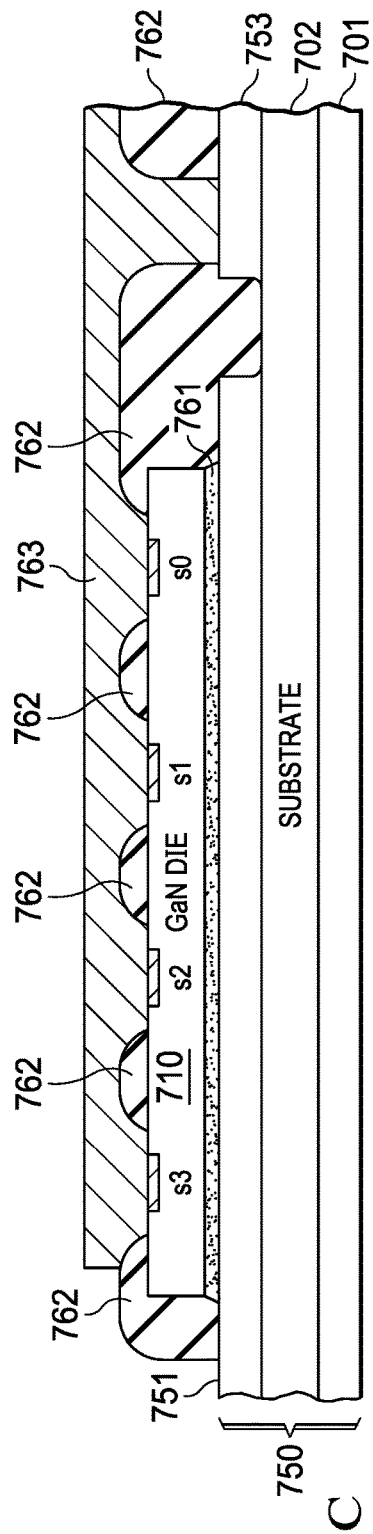

FIGS. 7A-7C are cross-sectional views illustrating fabrication of an example planar interconnect structure. In this example, multilayer substrate 750 has been fabricated using known or later developed fabrication techniques. In this example, multilayer substrate 750 includes a ceramic layer 702, a heat sink layer 701, and a patterned electrically conductive layer that includes example regions 751, 753. In this example, source pad 753 is coupled to other source pads in a similar manner as described herein above for source pad 653 (FIG. 6A, 6B) by a patterned conductive region that is not shown. In other examples, the multilayer region may include more, or fewer, layers that are patterned to provide signal routing, dielectric isolation, etc.

In this example, conductive regions 751 and 753 are printed with a copper paste using a known thick printed copper (TPC) process. A mask or screen is used to form region 754 during the printing step to define source pad 751 and to separate conductive region 751 from source pad 753.

FIG. 7A illustrates a portion of multilayer substrate 750 on which a die is mounted on a surface of multilayer substrate 750 in a dead bug configuration. In this example the IC die is GaN FET 110 as described hereinabove in more detail. A flat surface of the IC die 710 is bonded to the surface of multilayer substrate 750 using a bonding layer 761. The opposite surface that includes the exposed bond pads such as s0-s3 is facing away from multilayer substrate 750. In this example, bonding layer 761 provides a thermal path to conduct heat away from GaN FET 110 into multilayer substrate 750 and thereby facilitate heat dissipation via layer 701.

FIG. 7B illustrates a portion of a dielectric layer 762 that is formed over IC die 110 and a portion of multilayer substrate 750. In this example, dielectric layer 762 is applied through a masking layer that is later removed using a known or later developed thick film printing technique. In this example, dielectric layer 762 is formed using Heraeus IP9246 high voltage isolation material. IP9246 is Pb, Cd, and Ni free high temperature dielectric that can be fired in nitrogen. It is compatible with a variety of thick print copper pastes. It has a low thermal expansion coefficient.

FIG. 7C illustrates an electrically conductive layer that has been formed over IC die 110 and dielectric layer 762 to form planar interconnect structure 763. In this example, electrically conductive layer 763 is applied through a masking layer that is later removed using a known or later developed thick film printing technique. In this example, conductive layer 763 is formed using Heraeus 7403 copper paste.

Table 1 summarizes the characteristics of the multiple layers illustrated in FIG. 7C. The top layer is planar interconnect 763, dielectric layer 1 is dielectric layer 762, middle metal is source pad 753, dielectric layer 2 is ceramic core 702, and bottom metal is thermal layer 701.

TABLE 1

| physical characteristics | | | | | |
|---|---|---|---|---|---|
| Layer | Material | Thickness (um) | Thermal conductivity (W/mk) | Dielectric Constant | Function |
| Top Metal | Fired Cu | 300/100 | 290 | | Top circuitry layer |
| Dielectric layer 1 | Fired dielectric thick film | 25 | 5 | 7 | Filled vias to connect top/middle Cu layers |
| Middle Metal | Fired Cu | 100 | 290 | | Power loop return/signal pin shielding |
| Dielectric layer 2 | AlN/Al2O3 plate | 380 | 170/24 | 9/9 | Isolation |
| Bottom Metal | Fired Cu | 300/100 | 290 | | Thermal plane for heat dissipation |

In this example, thick copper pastes, also referred to as "printed ink," may be used to print thick layers of electrically conductive printed ink that includes copper particles onto ceramic substrates to form the planar interconnect lines over a non-planar surface, such as the surface of dielectric 762. The printed ink may be applied by screen or stencil printing, dried in air, and fired in a Nitrogen atmosphere. High tech stencils such as MTeCK-stencils of Christian Koenen GmbH offer quick build-up of thickness in few layers. To achieve ever thicker layers in one firing step it is also possible to print/dry the copper paste up to three times and then co-fire this build-up.

In another example, an ink jet type printing process may be used to build up a thick layer of electrically conductive printed ink that includes copper particles or other electrically conductive material to form the planar interconnect system. For example, an ink jet printing process may be used to deposit conductive particles without the use of a mask or stencil.

In this example, the pastes or other materials that is used to form the printed ink planar interconnect structures is based on copper particles. In other examples, the paste may include various types of conductive particles as needed to be compatible with a selected fabrication process. For example, silver or gold particles may be included in the printed ink paste.

The structures illustrated in FIGS. 6A, 6B are schematic structures that are useful for electrical simulation. The structures illustrated in FIGS. 7a-7C are more realistic illustrations of the fabrication process.

Figure 8:
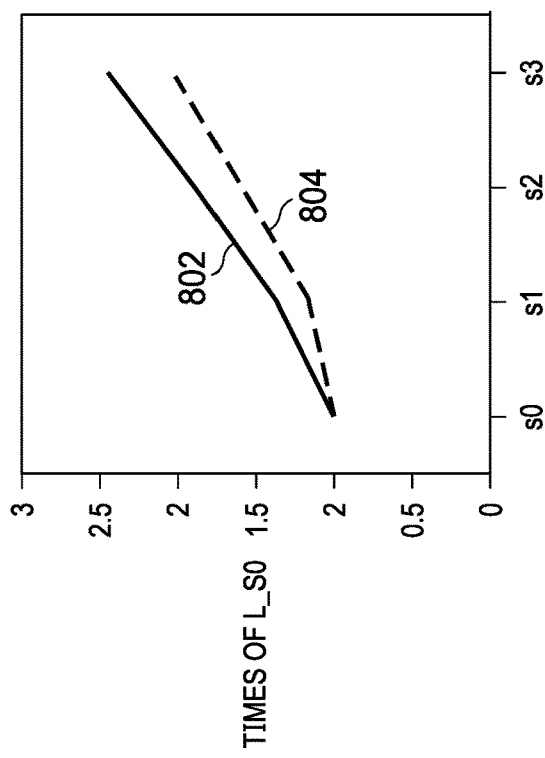
FIG. 8 is a plot illustrating a comparison of inductance between a bond wire interconnect and an example planar interconnect structure.

FIG. 8 is a plot illustrating a comparison of inductance between a bond wire interconnect 401 (FIG. 4A, 4B) and an example planar interconnect structure such as planar interconnect line 632 in FIG. 6A, 6B. In this example, a simulation using a configuration as shown in FIG. 2 and FIG. 6A, 6B was performed. Plot line 802 illustrates a simulated performance of bond wire 401 while plot line 804 illustrates a simulated performance of planar interconnect line 632. The horizontal axis represents bond pads s0-s3, while the vertical axis represents switching time normalized to the inductance of pad s0 (L_S0). Plots 802, 804 show the inductance comparison at different pads. Plot 804 illustrates that the planar interconnect structure produces less parasitic inductance between the series of pads (s0, s1, . . . ). The inductance is normalized as a function of L_s0, where s0 is the shortest length.

Table 2 tabulates simulated inductance values at each bond pad s0-s3 for a wire bond interconnect structure and for a printed ink planar interconnect structure. In this example, the planar interconnect structure provides an 18% reduction in inductance and a corresponding reduction in switching time. The large planar interconnect contributes to this reduction in inductance. Another big contributor to inductance is the wire bond loop-height from the die surface. Wire bond tends to form loops which are much higher from die surface than the planar interconnect and thereby results in higher parasitic inductance

TABLE 2 simulation results for wire bond and printed ink

| AC L (nH) | 5 mil Wire Bond | Printed ink Structure | % Reduction |
|---|---|---|---|
| s0 | 0.378 | 0.375 | ~1% |
| s1 | 0.518 | 0.435 | ~16% |
| s2 | 0.716 | 0.596 | ~17% |
| s3 | 0.926 | 0.762 | ~18% |

Figure 9:
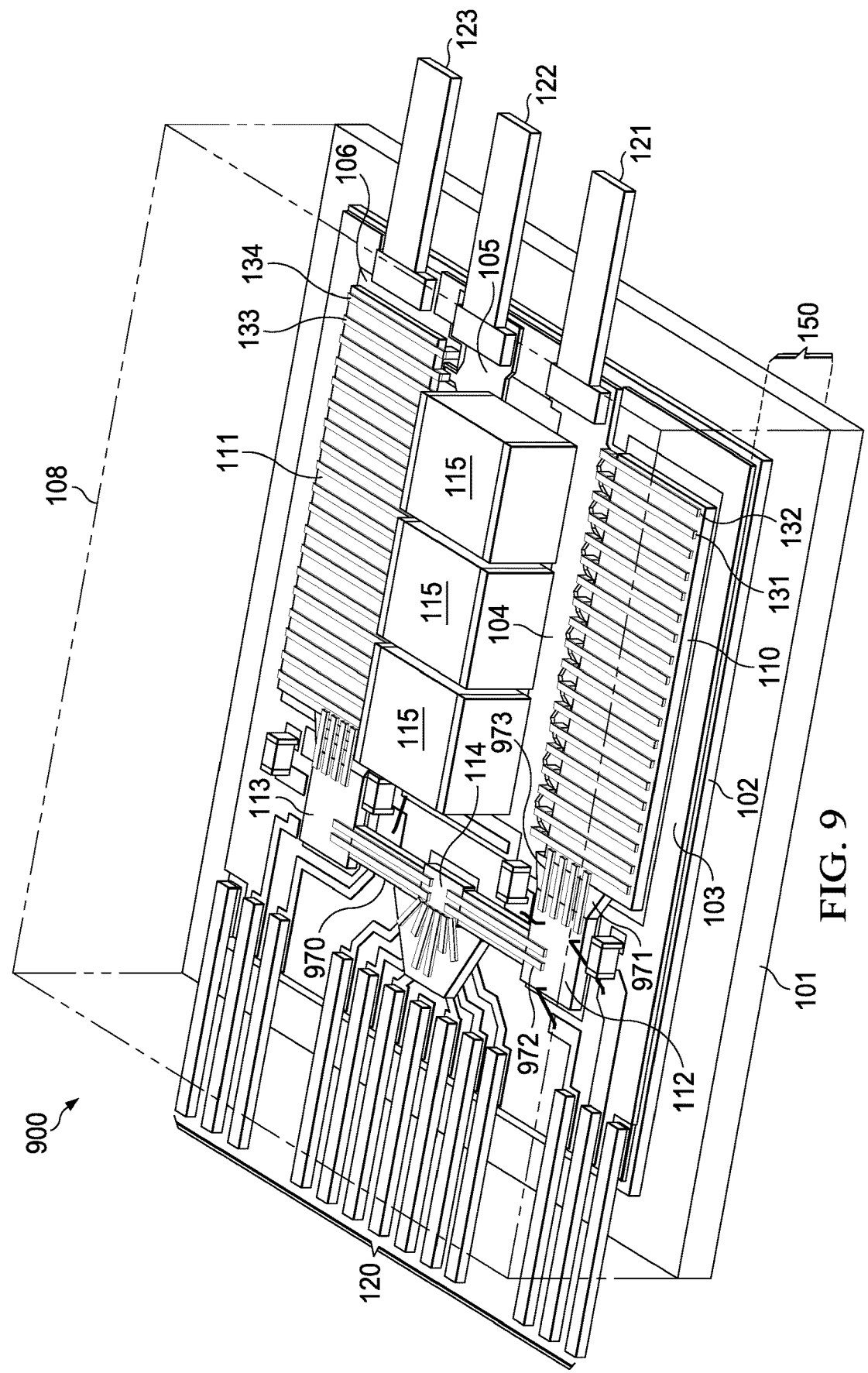
FIG. 9 is an isometric view of another example module that includes an example planar interconnect structure.

FIG. 9 is an isometric view of another example module 900 that includes an example planar interconnect structure. In this example, module 900 is similar to module 100 (see FIG. 1). However, in this example, bond wires between pre-driver 114 and drivers 112, 113 are eliminated by using a printed ink planar interconnect structure as described in more detail hereinabove. In this example, a dielectric layer is added in selected locations, such as between pre-driver 114 and drivers 112, 113 and between drivers 112, 113 and GaN FETs 110, 111 respectively to provide an approximately level base for planar interconnect lines that are deposited using printed ink paste. For example, dielectric regions 970, 971 are representative of various dielectric regions and planar interconnect signal lines 973 are representative of various planar interconnect lines that are fabricated on top of the dielectric regions using an electrically conductive ink paste to interconnect pre-driver 114, drivers 113, 113 and GaN FETs 110, 111. In this example, dielectric regions 970, 970 formed in a similar manner to dielectric layer 762 in FIG. 7B. Planer interconnect lines 972, 973 are formed in a similar manner to planer interconnect line 763 in FIG. 7C. In this manner, bond wires may be eliminated from module 900.

Other Embodiments

In described examples, two individual GaN FETs and associated drivers and pre-driver are mounted on a substrate to form a single half-bridge switching module. The GaN FETs are coupled to output terminals using a planar interconnect structure that has reduced inductance as compared to bond wire interconnects. In another example, more or fewer GaN FETs and associated components may be coupled to terminals or other connection nodes using a printed ink planar interconnect structure.

In described examples, the GaN FET has four bond pad connections in each one of multiple S/D regions. In other examples, more or fewer bond pad connections may be provided.

In described examples, a multilayer substrate having a ceramic core is used. In another example, other types of substrate may be used, such as a fiberglass/epoxy printed circuit board, a multilayer board with a core made of metal, glass, plastic, etc.

In described examples, a predriver and drivers are interconnected and coupled to control the GaN FETs using bond wires. In another example, printed ink planar interconnect lines as described herein may be used to interconnect the predriver, drivers, and GaN FETs.

In described examples, the finished module is fully encapsulated with a mold material. In another example, the module may be left open or enclosed in a protective shell, box, etc.

In this description, the term "couple" and derivatives thereof mean an indirect or direct, electrical connection. Thus, if a first device couples to a second device, that connection may be through a direct electrical connection or through an indirect electrical connection via other devices and connections.

Modifications are possible in the described embodiments, and other embodiments are possible, within the scope of the claims.

What is claimed is:

1. A circuit module comprising:
  a multilayer substrate having a first surface and an opposite second surface;
  a first conductive pad formed within a first one of the layers of the multilayer substrate;
  an integrated circuit (IC) die having a first surface and an opposite second surface, the IC die having a semiconductor device formed therein, the semiconductor device having a set of bond pads formed on the first surface of the IC die, the second surface of the IC die being bonded to the first surface of the multilayer substrate; and
  a first printed ink planar interconnect line coupled to a subset of the set of bond pads and to the conductive pad.

2. The circuit module of claim 1, wherein the printed ink includes copper particles.

3. The circuit module of claim 1, wherein the printed ink includes silver or gold particles.

4. The circuit module of claim 1, wherein a heat dispersing layer of the multilayer substrate forms the second surface of the multilayer substrate.

5. The circuit module of claim 1, wherein the semiconductor device is a GaN FET.

6. The circuit module of claim 1, further comprising:
  a second IC die mounted to the first surface of the multilayer substrate;
  at least one passive component coupled to the first surface of the multilayer substrate; and
  encapsulation material covering the first surface of the multilayer substrate, the IC die, the second IC die, and the passive component.

7. The circuit module of claim 6, further comprising a printed ink planar interconnect control line coupled between a terminal on the second IC and a terminal in the semiconductor device.

8. A circuit module comprising:
a multilayer substrate having a first surface and an opposite second surface;
a first conductive pad formed within a first one of the layers of the multilayer substrate;
a second conductive pad formed within a second one of the layers of the multilayer substrate;
an integrated circuit (IC) die having a first surface and an opposite second surface, the IC die having a semiconductor device formed therein, the semiconductor device having a set of bond pads formed on the first surface of the IC die, wherein the set of bond pads is a first set of bond pads and the semiconductor device has a second set of bond pads formed on the first surface of the IC die, the second surface of the IC die being bonded to the first surface of the multilayer substrate;
a first printed ink planar interconnect line coupled to the set of bond pads and to the conductive pad; and
a second printed ink planar interconnect line coupled to the second set of bond pads and to the second conductive pad.

9. A circuit module comprising:
a multilayer substrate having a first surface and an opposite second surface;
a first conductive pad formed within a first one of the layers of the multilayer substrate;
a second conductive pad formed within a second one of the layers of the multilayer substrate;
an integrated circuit (IC) die having a first surface and an opposite second surface, the IC die having a GaN FET semiconductor device formed therein, the GaN FET having a set of source bond pads, a set of drain bond pads, and a gate bond pad all formed on the first surface of the IC die, the second surface of the IC die being bonded to the first surface of the multilayer substrate;
a first printed ink planar interconnect line coupled to the set of source bond pads and to the first conductive pad; and
a second printed ink planar interconnect line coupled to the set of drain bond pads and to the second conductive pad.

10. The circuit module of claim 9 further comprising:
a second IC die mounted to the first surface of the multilayer substrate, the second IC having an output bond pad; and
a third printed ink planar interconnect line coupled between the output bond pad on the second IC and the gate bond pad on the GaN FET.

11. The circuit module of claim 9, wherein the printed ink includes copper particles.

12. The circuit module of claim 9, wherein the printed ink includes silver or gold particles.

13. The circuit module of claim 9, wherein a heat dispersing layer of the multilayer substrate forms the second surface of the multilayer substrate.

14. A method for fabricating a module, the method comprising:
fabricating a multilayer substrate having an exposed surface;
patterning a first conductive layer of the multilayer substrate to form a conductive pad;
patterning a second conductive layer of the multilayer substrate to form a second conductive pad;
bonding an integrated circuit (IC) die to the exposed surface of the multilayer substrate such that a set of bond pads on the IC die face away from the exposed surface of the multilayer substrate;
printing a patterned layer of dielectric over the IC die and the conductive pad such that the set of bond pads and the conductive pad are exposed;
printing a patterned layer of conductive ink to form a first printed ink planar interconnect line to couple a portion of the set of bond pads to the conductive pad; and
wherein printing the patterned layer of conductive ink also forms a second printed ink planar interconnect line to couple a second portion of the set of bond pads to the second conductive pad.

* * * * *